United States Patent
Park et al.

(10) Patent No.: US 10,767,081 B2
(45) Date of Patent: Sep. 8, 2020

(54) CHEMICAL MECHANICAL POLISHING SLURRY COMPOSITION FOR POLISHING POLYCRYSTALLINE SILICON FILM

(71) Applicant: SOULBRAIN CO., LTD., Seongnam-si, Gyeonggi-do (KR)

(72) Inventors: Kyung Il Park, Seongnam-si (KR); Seok Joo Kim, Seongnam-si (KR); Hyeong Ju Lee, Seongnam-si (KR)

( * ) Notice: Subject to any disclaimer, the term of this patent is extended or adjusted under 35 U.S.C. 154(b) by 0 days.

(21) Appl. No.: 16/192,748

(22) Filed: Nov. 15, 2018

(65) Prior Publication Data

US 2019/0161645 A1    May 30, 2019

(30) Foreign Application Priority Data

Nov. 29, 2017  (KR) .................. 10-2017-0161624

(51) Int. Cl.
| | | |
|---|---|---|
| *C09G 1/00* | (2006.01) | |
| *C09G 1/02* | (2006.01) | |
| *C09G 1/04* | (2006.01) | |
| *C09G 1/06* | (2006.01) | |
| *H01L 21/304* | (2006.01) | |
| *H01L 21/306* | (2006.01) | |
| *H01L 21/3105* | (2006.01) | |
| *H01L 21/321* | (2006.01) | |
| *H01L 21/461* | (2006.01) | |

(52) U.S. Cl.
CPC .................. *C09G 1/02* (2013.01); *C09G 1/00* (2013.01); *C09G 1/04* (2013.01); *C09G 1/06* (2013.01); *H01L 21/304* (2013.01); *H01L 21/32115* (2013.01); *H01L 21/461* (2013.01); *H01L 21/30625* (2013.01); *H01L 21/31053* (2013.01)

(58) Field of Classification Search
None
See application file for complete search history.

(56) References Cited

U.S. PATENT DOCUMENTS

| | | | | |
|---|---|---|---|---|
| 2002/0193451 A1* | 12/2002 | Motonari | ................. | C09G 1/02 516/9 |
| 2007/0098909 A1* | 5/2007 | Tomonari | ................. | C09D 5/38 427/407.1 |
| 2007/0181534 A1* | 8/2007 | Kamimura | ............ | B24B 37/044 216/88 |
| 2011/0258938 A1* | 10/2011 | Morinaga | ................ | B24D 3/00 51/309 |

* cited by examiner

*Primary Examiner* — Stephanie P Duclair
(74) *Attorney, Agent, or Firm* — Jongkook Park

(57) ABSTRACT

A chemical mechanical polishing slurry composition for polishing a polycrystalline silicon film is presented, comprising: a solvent; a polishing agent; a pH adjuster; and at least one additive selected from the group consisting of a compound represented by Chemical Formula 1 below, a compound represented by Chemical Formula 2 below, and a tautomer thereof.

The chemical mechanical polishing slurry composition for polishing a polycrystalline silicon film exhibits a high polishing speed and has various polishing selectivities when employed in a process for polishing a polycrystalline silicon film of a semiconductor wafer, and thus the composition may be effectively used as a composition for a process for polishing a polycrystalline silicon surface for the formation of highly integrated multilayer structured devices.

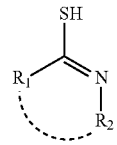

[Chemical Formula 1]

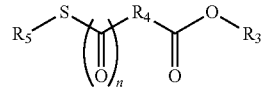

[Chemical Formula 2]

9 Claims, No Drawings

CHEMICAL MECHANICAL POLISHING SLURRY COMPOSITION FOR POLISHING POLYCRYSTALLINE SILICON FILM

CROSS-REFERENCE TO RELATED APPLICATIONS

This application claims priority under 35 U.S.C. § 119 to Korean Patent Application No. 10-2017-0161624, filed on Nov. 29, 2017, in the Korean Intellectual Property Office, the disclosure of which is incorporated herein by reference in its entirety.

TECHNICAL FIELD

The following disclosure relates to a chemical mechanical polishing slurry composition for polishing a polycrystalline silicon film.

BACKGROUND

In the semiconductor process, chemical mechanical planarization (CMP) is used as a surface polishing process for forming highly integrated multilayer structured devices. As the pattern size of semiconductors gradually decreases, the importance of the polishing process in the manufacture of patterns is gradually increasing. In a process for manufacturing a semiconductor device, single crystal silicon wafers, which are capable of making initial material at a low cost and making an oxide film with excellent electrical insulation properties, are used as a main material. In the semiconductor process, surface roughness of the silicon wafer has a great influence on subsequent processes, and thus performance of planarization using the CMP process is essential. Polycrystalline silicon thin film is used in processes for manufacturing integrated chips (ICs), recess channel array transistors (RCATs), and 3D Fin Field-effect transistors (FinFET), and thus there is a need for research on minimization of the surface roughness using the CMP process.

Polishing compositions may be used for polishing silicon materials, i.e., silicon groups such as silicon single crystal, amorphous silicon, polysilicon, and the like, and silicon compounds such as silicon nitride, and silicon oxide. More specifically, for example, polishing compositions are mainly used for polishing silicon substrates such as single crystal silicon substrates, or the like; or for polishing silicon group films such as amorphous silicon films, polycrystalline silicon films, or the like, or silicon compounds such as silicon nitride, silicon oxide, or the like, formed on the silicon substrate. Silicon compound films include low-k films with a relative permittivity of 3 or less. In low-k films, the polishing selectivity and polishing speed are key points for the semiconductor polishing process. Thus, there is a need for studies on a polishing slurry composition with a high polishing speed and various polishing selectivities.

Therefore, the present inventors studied compositions for polishing a polycrystalline silicon film, found that when a compound including a thio group or a thiol group was used and added as an additive in a polycrystalline silicon polishing composition including a polishing agent it was possible to prepare a polishing slurry composition with an improved polishing speed and various polishing selectivities, and thus completed the present invention.

SUMMARY

An embodiment of the present invention is directed to providing a chemical mechanical polishing slurry composition for polishing a polycrystalline silicon film.

The present invention is not limited to the above-described technical problems, and other technical problems that are not mentioned may be clearly understood from the following description by those skilled in the art to which the present invention pertains.

To solve the above-mentioned problem, the present invention provides a chemical mechanical polishing slurry composition for polishing a polycrystalline silicon film, comprising: a solvent; a polishing agent; a pH adjuster; and at least one additive selected from the group consisting of a compound represented by Chemical Formula 1 below, a compound represented by Chemical Formula 2 below, and a tautomer thereof:

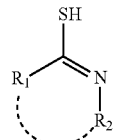

[Chemical Formula 1]

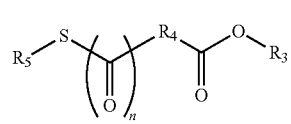

[Chemical Formula 2]

Here, $R_1$, $R_2$, $R_3$, $R_4$, $R_5$, and n are the same as defined in this specification.

Further, the compound represented by Chemical Formula 1 may be thiourea, thioacetamide, 2-amino-5-mercapto-1,3-thiadiazole, 2-mercaptothiazoline, mercaptobenzothiazole or 2-mercaptobenzimidazole, and the compound represented by Chemical Formula 2 may be thioglycolic acid, thiosuccinic acid, 3,3'-thiodipropionic acid, or didodecyl 3,3'-thiodipropionate.

Herein, the content of the additive may be 0.01 to 0.5 wt % based on the total weight of the polishing slurry composition, and the pH of the polishing slurry composition may be 2 to 5.

In addition, the polishing agent may be colloidal silica, fumed silica, ceria or alumina, the content of the polishing agent may be 0.1 to 5.0 wt %, based on the total weight of the polishing slurry composition, and the solvent may be distilled water.

DETAILED DESCRIPTION OF EMBODIMENTS

Hereinafter, the present invention is described in more detail. However, the present invention may be implemented in many different forms and is not limited to the embodiments described herein. The present disclosure will be defined only by the scope of the appended claims.

In addition, terms used in the present invention are employed only to describe specific embodiments, and are not intended to limit the invention. Unless explicitly defined otherwise, singular expressions include a plurality of expressions. In addition, unless specifically described to the contrary, the description 'including' or 'comprising' any element throughout the specification of the present invention will be understood to imply the inclusion of stated elements, but not the exclusion of any other elements.

An aspect of the present invention provides a chemical mechanical polishing slurry composition for polishing a polycrystalline silicon film, comprising: a solvent; a polishing agent; a pH adjuster; and at least one additive selected from the group consisting of a compound represented by Chemical Formula 1 below, a compound represented by Chemical Formula 2 below, and a tautomer thereof:

[Chemical Formula 1]

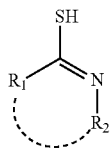

wherein $R_1$ may be hydrogen, $-NH_2$, $-SH$, a linear or branched $C_1$-$C_6$ alkyl, a linear or branched $C_1$-$C_6$ alkylamine, or a linear or branched $C_1$-$C_6$ alkylthiol, and $R_2$ may be hydrogen, $-NH_2$, $-NHCH_3$, a linear or branched $C_1$-$C_6$ alkyl or a $C_5$-$C_{10}$ aryl, wherein $R_1$ and $R_2$ may be linked together with atoms to which they are respectively bonded to form substituted or unsubstituted 5- to 11-membered heteroaryls including at least one N;

[Chemical Formula 2]

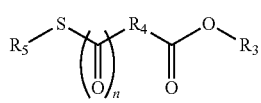

wherein $R_3$ may be hydrogen or a linear or branched $C_1$-$C_{20}$ alkyl, $R_4$ may be a linear or branched $C_1$-$C_8$ alkylene, $R_5$ may be hydrogen or

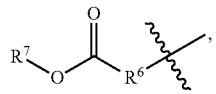

$R^6$ may be a linear or branched $C_1$-$C_8$ alkylene, $R^7$ may be hydrogen or a linear or branched $C_1$-$C_{20}$ alkyl, and n may be 0 or 1.

Further, preferably, in the chemical mechanical polishing slurry composition for polishing a polycrystalline silicon film, $R_1$ may be hydrogen, $-NH_2$, $-SH$, methyl, ethyl, methylamine, ethylamine, methylthiol or ethylthiol, and $R_2$ may be hydrogen, $-NH_2$, $-NHCH_3$, methyl, ethyl or phenyl, wherein $R_1$ and $R_2$ may be linked together with atoms to which they are respectively bonded to form a substituted or unsubstituted 5- to 9-membered heteroaryl including at least one N.

In addition, in the chemical mechanical polishing slurry composition for polishing a polycrystalline silicon film, $R_3$ may be hydrogen or a linear or branched $C_6$-$C_{14}$ alkyl, $R_4$ may be a linear or branched $C_1$-$C_4$ alkylene, $R_5$ may be hydrogen or

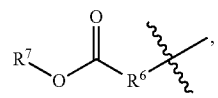

$R^6$ may be a linear or branched $C_1$-$C_4$ alkylene, $R^7$ may be hydrogen or a linear or branched $C_6$-$C_{14}$ alkyl, and n may be 0 or 1.

More preferably, in the chemical mechanical polishing slurry composition for polishing a polycrystalline silicon film, $R_1$ may be hydrogen, $-NH_2$, $-SH$ or methyl, $R_2$ may be hydrogen, $-NHCH_3$, ethyl or phenyl, $R_1$ and $R_2$ may be linked together with atoms to which they are respectively bonded to form a substituted or unsubstituted 5- to 9-membered heteroaryl including at least one N, $R_3$ may be hydrogen or a linear or branched $C_{10}$-$C_{14}$ alkyl, $R_4$ may be a linear or branched $C_1$-$C_3$ alkylene, $R_5$ may be hydrogen or

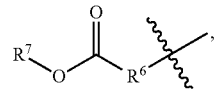

$R_6$ may be a linear or branched $C_1$-$C_3$ alkylene, $R_7$ may be hydrogen or a linear or branched $C_{10}$-$C_{14}$ alkyl, and n may be 0 or 1.

Further, and most preferably, the compound represented by Chemical Formula 1 may be thiourea, thioacetamide, 2-amino-5-mercapto-1,3-thiadiazole, 2-mercaptothiazoline, mercaptobenzothiazole or 2-mercaptobenzimidazole, and the compound represented by Chemical Formula 2 may be thioglycolic acid, thiosuccinic acid, 3,3'-thiodipropionic acid, or didodecyl 3,3'-thiodipropionate.

Chemical structures of the compounds represented by Chemical Formulas 1 and 2 are summarized in Table 1 below.

TABLE 1

| Classification | Chemical Name | Chemical Structure |
|---|---|---|
| | | Chemical Formula 1 |
| 1 | Thiourea | ![structure] $H_2N-C(SH)=NH$ |
| 2 | Thioacetamide | ![structure] $H_3C-C(SH)=NH$ |
| 3 | 2-Amino-5-mercapto-1,3,4-thiadiazole | ![structure] HS—(thiadiazole ring)—SH |

TABLE 1-continued

| Classification | Chemical Name | Chemical Structure |
|---|---|---|
| 4 | 2-Mercaptothiazoline | 2-thiazoline with SH at 2-position |
| 5 | Mercaptobenzothiazole | benzothiazole with SH at 2-position |
| 6 | 2-Mercaptobenzimidazole | benzimidazole (NH) with SH at 2-position |

Chemical Formula 2

| | | |
|---|---|---|
| 1 | Thioglycolic acid | HS–CH$_2$–C(=O)OH |
| 2 | Thiosuccinic acid | HOOC–CH$_2$–CH(SH)–COOH |
| 3 | 3,3'-Thiodipropionic acid | HOOC–CH$_2$CH$_2$–S–CH$_2$CH$_2$–COOH |
| 4 | Didodecyl 3,3'-thiodipropionate | H$_3$C(H$_2$C)$_{10}$H$_2$CO–C(=O)–CH$_2$CH$_2$–S–CH$_2$CH$_2$–C(=O)–OCH$_2$(CH$_2$)$_{10}$CH$_3$ |

The compounds summarized in Table 1 above are shown as preferred examples of the compounds represented by Chemical Formulas 1 and 2, and the compounds represented by Chemical Formulas 1 and 2 according to an aspect of the present invention are not limited to those shown in Table 1.

In addition, in the chemical mechanical polishing slurry composition for polishing a polycrystalline silicon film, the additive includes not only the compounds represented by Chemical Formulas 1 and 2 as described above, but also compounds in the forms of thiones and thiols from the thione-thiol tautomerism thereof. For example, as a compound capable of being employed as the additive, thiourea includes both the compound in the form of a thione, represented by Chemical Formula a below, and the compound in the form of a thiol, represented by Chemical Formula b below:

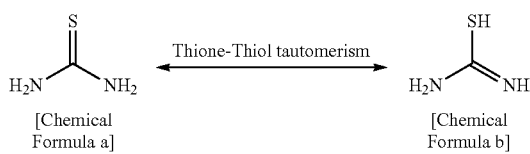

[Chemical Formula a]   Thione-Thiol tautomerism   [Chemical Formula b]

Here, the content of the additive may be 0.03 to 0.6 wt %, 0.02 to 0.55 wt %, and preferably 0.01 to 0.5 wt %, based on the total weight of the polishing slurry composition. If the content of the additive is less than 0.01 wt %, the amount of the additive compound to be added may be too low for the effects of promoting the polishing speed, improving the polishing selectivity of the polycrystalline silicon film due to the additive compound, and the like, to be exhibited. If the content of the additive exceeds 0.5 wt %, the content of the additive may be excessively high, and thus the polishing properties originally sought after may be deteriorated.

The chemical mechanical polishing slurry composition for polishing a polycrystalline silicon film may include a compound represented by Chemical Formula 1 below, a compound represented by Chemical Formula 2 below, or a tautomer thereof as an additive of the polishing composition, as described above, to improve the polishing speed of the polishing process and to achieve various polishing selectivities with respect to the polycrystalline silicon film, thereby enabling achievement of an efficient polishing process for a silicon wafer (see Experimental Examples 1 and 2). Therefore, the chemical mechanical polishing slurry composition for polishing a polycrystalline silicon film may be effectively used as a composition for the surface polishing process used in the formation of highly integrated multilayer structured devices.

Further, in the chemical mechanical polishing slurry composition for polishing a polycrystalline silicon film, the pH of the polishing slurry composition may be 1.8 to 5.2 or 1.9 to 5.1, and more preferably 2 to 5. When the pH of the polishing slurry composition exceeds 5, the excessive highness of the pH induces a decrease in the zeta potential to achieve electrical neutrality of the surface charge, and thus the stability and performance of the slurry may be deteriorated.

Here, the pH adjuster used to control the pH of the chemical mechanical polishing slurry composition for polishing a polycrystalline silicon film may be an inorganic acid-based pH adjuster, a carboxylic acid-based pH adjuster, an amine base-based pH adjuster, an alkali hydroxide-based pH adjuster, an ammonium hydroxide-based pH adjuster (such as a tetraalkylammonium hydroxide), and the like. More specifically, the pH adjuster may include an acidic adjuster or a basic adjuster. Preferably, the acidic adjuster may be selected from hydrochloric acid (HCl), nitric acid ($HNO_3$), sulfuric acid ($H_2SO_4$), phosphoric acid ($H_3PO_4$), carboxylic acid ($CH_3COOH$), and a combination thereof, and the basic modifier may be selected from potassium hydroxide (KOH), sodium hydroxide (NaOH), ammonium hydroxide ($NH_4OH$), tetramethylamine hydroxide (TMAH), tetramethylamine (TMA), and a combination thereof. More preferably, the acidic adjuster of nitric acid ($HNO_3$), phosphoric acid ($H_3PO_4$) or carboxylic acid ($CH_3COOH$) and the basic adjuster of potassium hydroxide (KOH) or sodium hydroxide (NaOH) may be employed.

In addition, in the chemical mechanical polishing slurry composition for polishing a polycrystalline silicon film, the polishing agent employed may be colloidal silica, fumed silica, ceria, alumina, or the like, and more preferably colloidal silica. As the polishing agent, in addition to the above-listed polishing agents, polishing agents generally used in a polishing composition for a polycrystalline silicon film may be used within a range in which the effects of the present invention are not impaired.

Here, the colloidal silica may have a particle size of 40 nm to 120 nm, and may preferably have a spherical shape. When the particle size of the polishing agent is lower than 30 nm, the polishing efficiency of the polycrystalline silicon film may be deteriorated. When the particle size of the polishing agent exceeds 100 nm, excessive scratching may occur on a wafer surface at the time of a polishing process.

The content of the polishing agent may be 0.08 to 5.2 wt %, 0.09 to 5.1 wt %, and more preferably 0.1 to 5.0 wt %, based on the total weight of the polishing slurry composition. When the content of the polishing agent is 0.1 wt % or less, the content of the polishing agent included in the slurry composition may be too low to achieve proper polishing performance on the surface of the polycrystalline silicon. When the content of the polishing agent is 5.0 wt % or higher, the content of the polishing agent may be excessively high, and thus the stability of the slurry may be lowered, and it may be difficult to control the polishing amount.

In addition, in the chemical mechanical polishing slurry composition for polishing a polycrystalline silicon film, the solvent may be distilled water.

Hereinafter, Examples of the present invention will be described in detail so that those skilled in the art may easily practice the present invention. However, the present invention may be implemented in various different forms and is not limited to the Examples provided herein.

Example 1: Preparation 1 of Chemical Mechanical Polishing Slurry Composition

A slurry composition for polishing was prepared by mixing 0.1 wt % of thioacetamide as a polishing accelerator, 2 wt % of a colloidal silica polishing agent, and distilled water. The pH of the prepared chemical mechanical polishing slurry composition was then adjusted to be between 3.0 and 4.0 by addition of a pH adjuster.

Example 2: Preparation 2 of Chemical Mechanical Polishing Slurry Composition

A chemical mechanical polishing slurry composition was prepared in the same manner as in Example 1, except that 0.1 wt % of thiosuccinic acid was used as the polishing accelerator.

Example 3: Preparation 3 of Chemical Mechanical Polishing Slurry Composition

A chemical mechanical polishing slurry composition was prepared in the same manner as in Example 1, except that 0.1 wt % of didodecyl-3,3'-thiodipropionate was used as the polishing accelerator.

Example 4: Preparation 4 of Chemical Mechanical Polishing Slurry Composition

A chemical mechanical polishing slurry composition was prepared in the same manner as in Example 1, except that 0.1 wt % of 2-mercaptobenzimidazole was used as the polishing accelerator.

Example 5: Preparation 5 of Chemical Mechanical Polishing Slurry Composition

A chemical mechanical polishing slurry composition was prepared in the same manner as in Example 1, except that 0.5 wt % of thiosuccinic acid was used as the polishing accelerator.

Comparative Example 1: Preparation 6 of Chemical Mechanical Polishing Slurry Composition A slurry composition for polishing was prepared by mixing 2 wt % of a colloidal silica polishing agent and distilled water. The pH of the prepared chemical mechanical polishing slurry composition was then adjusted to be between 3.0 and 4.0 through addition of a pH adjuster.

The kinds and contents of the additives of the chemical mechanical polishing slurry compositions prepared in Examples 1 to 5 and Comparative Example 1 are summarized in Table 2 below.

TABLE 2

| Classification | Additive | Content (wt %) |
| --- | --- | --- |
| Example 1 | Thioacetamide | 0.1 |
| Example 2 | Thiosuccinic acid | 0.1 |
| Example 3 | Didodecyl-3,3'-thiodipropionate | 0.1 |
| Example 4 | 2-Mercaptobenzimidazole | 0.1 |
| Example 5 | Thiosuccinic acid | 0.5 |
| Comparative Example 1 | — | — |

Experimental Example 1: Silicon Nitride Film Polishing Experiment

In order to confirm the effects of the polishing speed and polishing selectivity of the chemical mechanical polishing slurry composition according to the present invention, an experiment was conducted to measure the polishing speed by polishing a surface of a wafer with silicon nitride deposited thereon using each of the slurry compositions prepared in Examples 1 to 5 and Comparative Example 1.

First, a wafer on which a silicon nitride film was deposited in an amount of 10,000 Å was prepared. After placing the wafer in contact with a polishing pad (IC1010 manufactured by Dow Chemical Company), each of the slurry compositions prepared in Examples 1 to 5 and Comparative Example 1 was used to perform rotary polishing at a polishing pressure of 3 psi and a polishing speed of 100 rpm. Here, a Poli-400 was used as the polisher.

The polishing speed of the $Si_3N_4$ layer of each of the compositions measured as a result of polishing is summarized in Table 3 below.

TABLE 3

| Classification | Additive | Content (wt %) | $Si_3N_4$ Polishing Speed (Å/min) |
|---|---|---|---|
| Example 1 | Thioacetamide | 0.1 | 265 |
| Example 2 | Thiosuccinic acid | 0.1 | 227 |
| Example 3 | Didodecyl-3,3'-thiodipropionate | 0.1 | 56 |
| Example 4 | 2-Mercaptobenzimidazole | 0.1 | 36 |
| Example 5 | Thiosuccinic acid | 0.5 | 282 |
| Comparative Example 1 | — | — | 215 |

Experimental Example 2: Polishing Experiment of Polycrystalline Silicon Film

In order to confirm the effects of the polishing speed and polishing selectivity of the chemical mechanical polishing slurry composition according to the present invention, an experiment was conducted to measure the polishing speed by polishing a surface of a wafer with silicon nitride deposited thereon using each of the slurry compositions prepared in Examples 1 to 5 and Comparative Example 1.

First, a wafer on which a silicon nitride film was deposited in an amount of 500 Å was prepared. After placing the wafer in contact with a polishing pad (IC1010 manufactured by Dow Chemical Company), the slurry compositions prepared in Examples 1 to 5 and Comparative Example 1 were used to perform rotary polishing at a polishing pressure of 3 psi and a polishing speed of 100 rpm. Here, a Poli-400 was used as the polisher.

The polishing speed of the Poly-Si layer of each of the compositions measured as a result of polishing is summarized in Table 4 below.

TABLE 4

| Classification | Additive | Content (wt %) | Poly-Si Layer Polishing Speed (Å/min) |
|---|---|---|---|
| Example 1 | Thioacetamide | 0.1 | 52 |
| Example 2 | Thiosuccinic acid | 0.1 | 87 |
| Example 3 | Didodecyl-3,3'-thiodipropionate | 0.1 | 13 |
| Example 4 | 2-Mercaptobenzimidazole | 0.1 | 24 |
| Example 5 | Thiosuccinic acid | 0.5 | 103 |
| Comparative Example 1 | — | — | 32 |

The polishing selectivity of the silicon nitride film with respect to the polycrystalline silicon film for each slurry composition was summarized based on the polishing speed of the $Si_3N_4$ layer and the poly-Si layer of each of Examples 1 to 5 and Comparative Example 1, measured through Experimental Example 1 and Experimental Example 2, and shown in Table 5 below.

TABLE 5

| Classification | Additive and Content | $Si_3N_4$ Polishing Speed (Å/min) | Poly-Si Layer Polishing Speed (Å/min) | Polishing Selectivity |
|---|---|---|---|---|
| Example 1 | Thioacetamide (0.1 wt %) | 265 | 52 | 5.1 |
| Example 2 | Thiosuccinic acid (0.1 wt %) | 227 | 87 | 2.1 |
| Example 3 | Didodecyl-3,3'-thiodipropionate (0.1 wt %) | 56 | 13 | 4.3 |
| Example 4 | 2-Mercaptobenzimidazole (0.1 wt %) | 36 | 24 | 1.5 |
| Example 5 | Thiosuccinic acid (0.5 wt %) | 282 | 103 | 2.7 |
| Comparative Example 1 | — | 215 | 32 | 6.7 |

As can be seen in Table 5, the chemical mechanical polishing slurry composition according to an embodiment of the present invention exhibited various ranges of polishing selectivity of the poly-Si layer with respect to the $Si_3N_4$ layer. Therefore, since it is possible to selectively adjust the selectivity required according to each process in the semiconductor process, the composition can be effectively used as a composition for a polycrystalline silicon surface polishing process for the formation of highly integrated multilayer structured devices.

Since the chemical mechanical polishing slurry composition for polishing a polycrystalline silicon film according to an embodiment of the present invention exhibits a high polishing speed and has various polishing selectivities in a process for polishing a polycrystalline silicon film of a semiconductor wafer, the composition may be effectively used as a composition for a process for polishing a polycrystalline silicon surface to result in the formation of highly integrated multilayer structured devices.

It should be understood that effects of the present invention are not limited to the effects described above, and include all effects that can be deduced from the detailed description of the present invention or the constitution of the invention described in the appended claims.

What is claimed is:

1. A chemical mechanical polishing slurry composition for polishing a polycrystalline silicon film, comprising:
a solvent; a polishing agent; a pH adjuster; and
at least one additive selected from the group consisting of a compound represented by Chemical Formula 1 below, a compound represented by Chemical Formula 2 below, and a tautomer thereof:

[Chemical Formula 1]

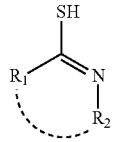

in Chemical Formula 1,
R1 is hydrogen, —SH, a linear or branched C1-C6 alkyl, a linear or branched C1-C6 alkylamine, or a linear or branched C1-C6 alkylthiol, and
R2 is hydrogen, —NH2, —NHCH3, a linear or branched C1-C6 alkyl or a C5-C10 aryl,

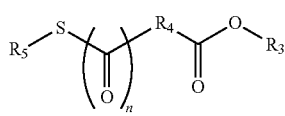
[Chemical Formula 2]

in Chemical Formula 2, R3 is hydrogen or a linear or branched C1-C20 alkyl,
R4 is a linear or branched C2-C8 alkylene,
R5 is hydrogen or

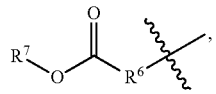

R6 is a linear or branched C1-C8 alkylene,
R7 is hydrogen or a linear or branched C1-C20 alkyl, and n is 0 or 1,
wherein the pH of the polishing slurry composition is 2 to 5.

2. The chemical mechanical polishing slurry composition for polishing a polycrystalline silicon film of claim 1, wherein R1 is hydrogen, —SH, methyl, ethyl, methylamine, ethylamine, methylthiol or ethylthiol, and
R2 is hydrogen, —NH2, —NHCH3, methyl, ethyl or phenyl.

3. The chemical mechanical polishing slurry composition for polishing a polycrystalline silicon film of claim 1, wherein
R3 is hydrogen or a linear or branched C6-C14 alkyl,
R4 is a linear or branched C2-C4 alkylene,
R5 is hydrogen or

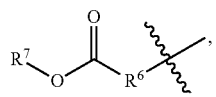

R6 is a linear or branched C1-C4 alkylene,
R7 is hydrogen or a linear or branched C6-C14 alkyl, and
n is 0 or 1.

4. The chemical mechanical polishing slurry composition for polishing a polycrystalline silicon film of claim 1, wherein
R1 is hydrogen, —SH or methyl,
R2 is hydrogen, —NHCH3, ethyl or phenyl,
R3 is hydrogen or a linear or branched C10-C14 alkyl,
R4 is a linear or branched C2-C3 alkylene, R5 is hydrogen or

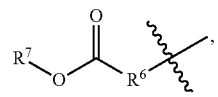

R6 is a linear or branched C1-C3 alkylene,
R7 is hydrogen or a linear or branched C10-C14 alkyl, and
n is 0 or 1.

5. The chemical mechanical polishing slurry composition for polishing a polycrystalline silicon film of claim 1, wherein the compound represented by Chemical Formula 1 is thioacetamide, and the compound represented by Chemical Formula 2 is thiosuccinic acid, 3,3'-thiodipropionic acid, or didodecyl 3,3'-thiodipropionate.

6. The chemical mechanical polishing slurry composition for polishing a polycrystalline silicon film of claim 1, wherein a content of the additive is 0.01 to 0.5 wt % based on the total weight of the polishing slurry composition.

7. The chemical mechanical polishing slurry composition for polishing a polycrystalline silicon film of claim 1, wherein the polishing agent is colloidal silica, fumed silica, ceria or alumina.

8. The chemical mechanical polishing slurry composition for polishing a polycrystalline silicon film of claim 1, wherein a content of the polishing agent is 0.1 to 5.0 wt %, based on the total weight of the polishing slurry composition.

9. The chemical mechanical polishing slurry composition for polishing a polycrystalline silicon film of claim 1, wherein the solvent is distilled water.

* * * * *